US007489214B2

(12) United States Patent
Shih

(10) Patent No.: US 7,489,214 B2
(45) Date of Patent: Feb. 10, 2009

(54) LOW-PASS FILTER

(75) Inventor: Yen-Yi Shih, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 138 days.

(21) Appl. No.: 11/309,478

(22) Filed: Aug. 11, 2006

(65) Prior Publication Data

US 2007/0103260 A1 May 10, 2007

(30) Foreign Application Priority Data

Oct. 21, 2005 (TW) .................................. 94137004

(51) Int. Cl.
*H01P 1/203* (2006.01)
*H03H 7/01* (2006.01)

(52) U.S. Cl. ....................................... 333/204; 333/185

(58) Field of Classification Search ................. 333/175, 333/176, 185, 203, 204
See application file for complete search history.

(56) References Cited

U.S. PATENT DOCUMENTS 5,977,847 A * 11/1999 Takahashi ................... 333/204
6,823,201 B2 11/2004 Kai et al.
7,098,759 B2 * 8/2006 Chang ......................... 333/204
7,142,836 B2 * 11/2006 Yang ........................... 455/307

FOREIGN PATENT DOCUMENTS

TW 1236213 7/2005
TW 1236797 7/2005

* cited by examiner

*Primary Examiner*—Seungsook Ham
(74) *Attorney, Agent, or Firm*—Wei Te Chung

(57) ABSTRACT

A low-pass filter (100) for reducing harmonic electromagnetic signals includes an input line (120), an output line (140), a transmission line (160), a first coupling line (180), and a second coupling line (190). The input line is used for input of electromagnetic signals. The output line is used for output of electromagnetic signals. The transmission line is electronically connected to the input line and the output line for capturing and transmitting electromagnetic signals. The first coupling line includes a first open end (184), and a first feed-in end (182) electronically connected to the transmission line. The second coupling line includes a second open end (194), and a second feed-in end (192) electronically connected to the second end. The first feed-in end is located opposite to the second feed-in end. The transmission line, the first coupling line, and the second coupling line collectively form a substantially G shape.

14 Claims, 2 Drawing Sheets

LOW-PASS FILTER

FIELD OF THE INVENTION

The present invention generally relates to a filter, and more particularly to a low-pass filter.

RELATED ART

In recent years, there has been a significant growth in WLAN (wireless local area network) technology due to the ever growing demand of wireless communication products. Such growth becomes particularly prominent after promulgation of IEEE 802.11 WLAN protocol in 1997. IEEE 802.11 WLAN protocol not only offers many novel features to current wireless communications, but also provides a solution of enabling two wireless communication products manufactured by different companies to communicate with each other. As such, the promulgation of IEEE 802.11 WLAN protocol is a milestone in the development of WLAN. Moreover, IEEE 802.11 WLAN protocol ensures that a core product is the only solution of implementing a single chip. Thus, IEEE 802.11 WLAN protocol can significantly reduce the cost of adopting wireless technology so as to enable WLAN to be widely employed in various wireless communication products.

Filters are necessary components of the wireless communication products. Some manufacturers in the art use a waveguide element, such as a microstrip, to act as a filter. The microstrip filter is formed on a printed circuit board of the wireless communication product to diminish harmonic electromagnetic signals. Generally, the wireless communication product is designed to be as small as practicable. Since filters are necessary components of wireless communication products, an approach to reduce the size of a wireless communication product is to reduce the size of the filters used therein.

Therefore, a heretofore unaddressed need exists in the industry to reduce the size of filters used in the wireless communication product.

SUMMARY

A low-pass filter is provided for reducing harmonic electromagnetic signals. The low-pass filter includes an input line, an output line, a transmission line, a first coupling line, and a second coupling line. The input line is used to input electromagnetic signals. The output line is used to output electromagnetic signals. The transmission line is electronically connected to the input line and the output line for capturing and transmitting electromagnetic signals. The first coupling line includes a first open end and a first feed-in end electronically connected to the transmission line. The second coupling line includes a second open end and a second feed-in end electronically connected to the second end. The first feed-in end is located opposite to the second feed-in end.

Other objectives, advantages and novel features of the present invention will be drawn from the following detailed description of preferred embodiments of the present invention with the attached drawings, in which:

DETAILED DESCRIPTION OF THE EMBODIMENTS

Figure 1:
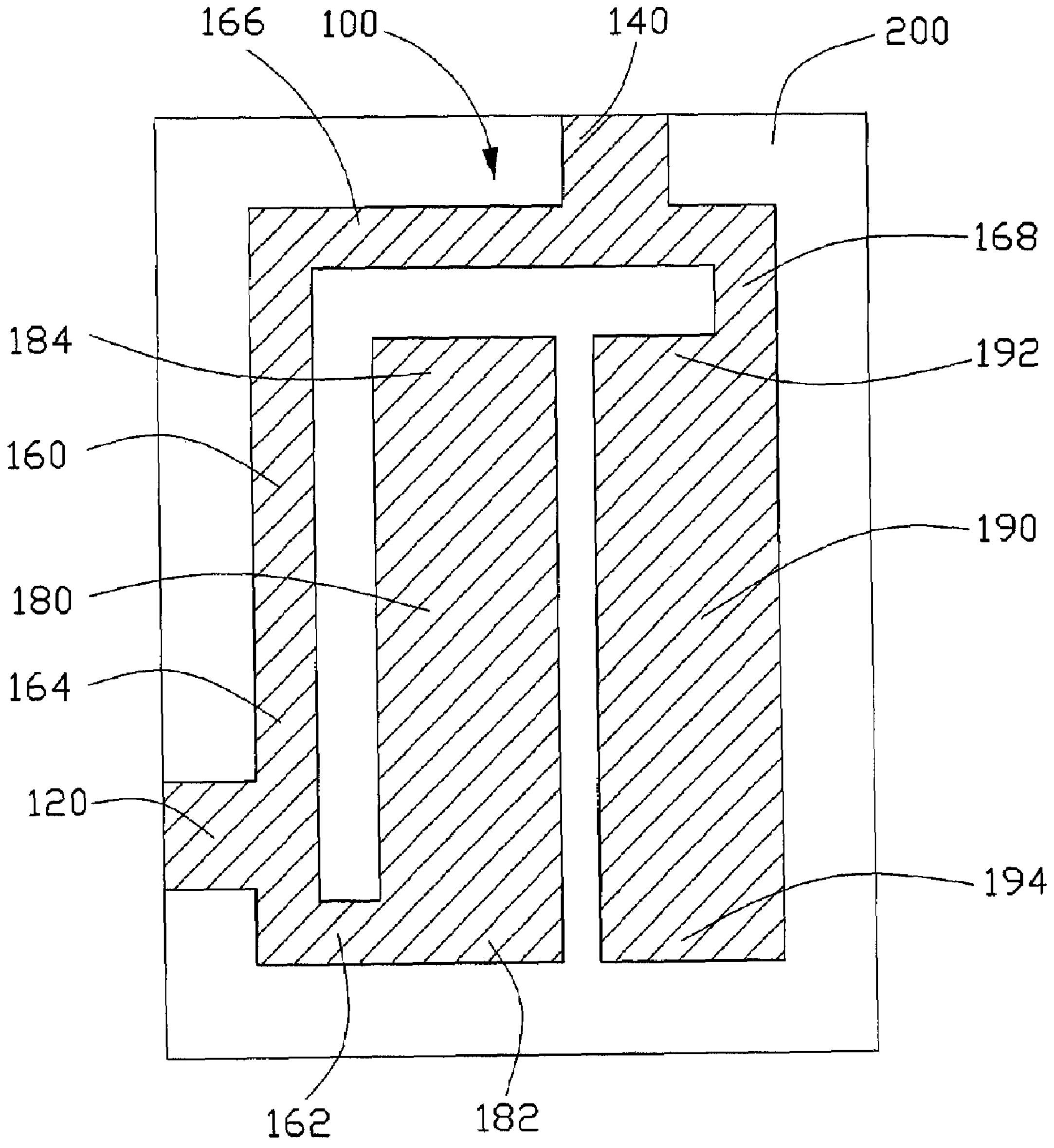
FIG. 1 is a schematic diagram of a low-pass filter of an exemplary embodiment of the invention.

FIG. 1 is a schematic diagram of a low-pass filter 100 of an exemplary embodiment of the present invention.

The low-pass filter 100 is mounted on a printed circuit board (PCB) 200 for reducing harmonic electromagnetic signals. The low-pass filter 100 includes an input line 120, an output line 140, a transmission line 160, a first coupling line 180, and a second coupling line 190.

The input line 120 is used to input the electromagnetic signal.

The output line 140 is used to output the electromagnetic signal.

The first coupling line 180 and the second coupling line 190 are used for capturing an electromagnetic signal at on a particular band. In this exemplary embodiment, the first coupling line 180 and the second coupling line 190 can capture the electromagnetic signal at 2.45 GHz.

The first coupling line 180 includes a first feed-in end 182 and a first open end 184. The first feed-in end 182 is electrically connected to the transmission line 160.

The second coupling line 190 includes a second feed-in end 192 and a second open end 194. The second feed-in end 192 is electrically connected to the transmission line 160, and is located opposite to the first feed-in end 182.

The transmission line 160 is electrically connected to the input line 120 and the output line 140. The transmission line 160 includes a first transmission part 162, a second transmission part 164, a third transmission part 166, and a fourth transmission part 168. The first transmission part 162 is electrically connected to the first feed-in end 182. The second transmission part 164 is electrically connected to the first transmission part 162 and the input line 120. The third transmission part 166 is electrically connected to the second transmission part 164 and the output line 140. The fourth transmission part 168 is electrically connected between the third transmission part 166 and the second feed-in end 192. The transmission line 160, the first-coupling line 180, and the second coupling line 190 collectively form a substantially G shape.

The transmission line 160 is used to capture and transmit the electromagnetic signal. The transmission line 160 is arranged around the first coupling line 180 and the second coupling line 190 for minimizing the size of the filter 100. The first coupling line 180 is arranged between the second coupling line 190 and the second transmission part 164, and is parallel to the second coupling line 190 and the second transmission part 164.

In this embodiment, lengths of the input line 120 and the output line 140 are randomly selected, and widths thereof are substantially 0.53 mm. A total length of the transmission line 160 is substantially 11.2 mm, and a width thereof is substantially 0.3 mm. A length of the first coupling line 180 is 5.6 mm, and a width is 1.15 mm. A length of the second coupling line 190 is 5.6 mm, and a width is 1.15 mm. A surface area of the low-pass filter 100 is approximately 24.7 mm2.

Figure 2:
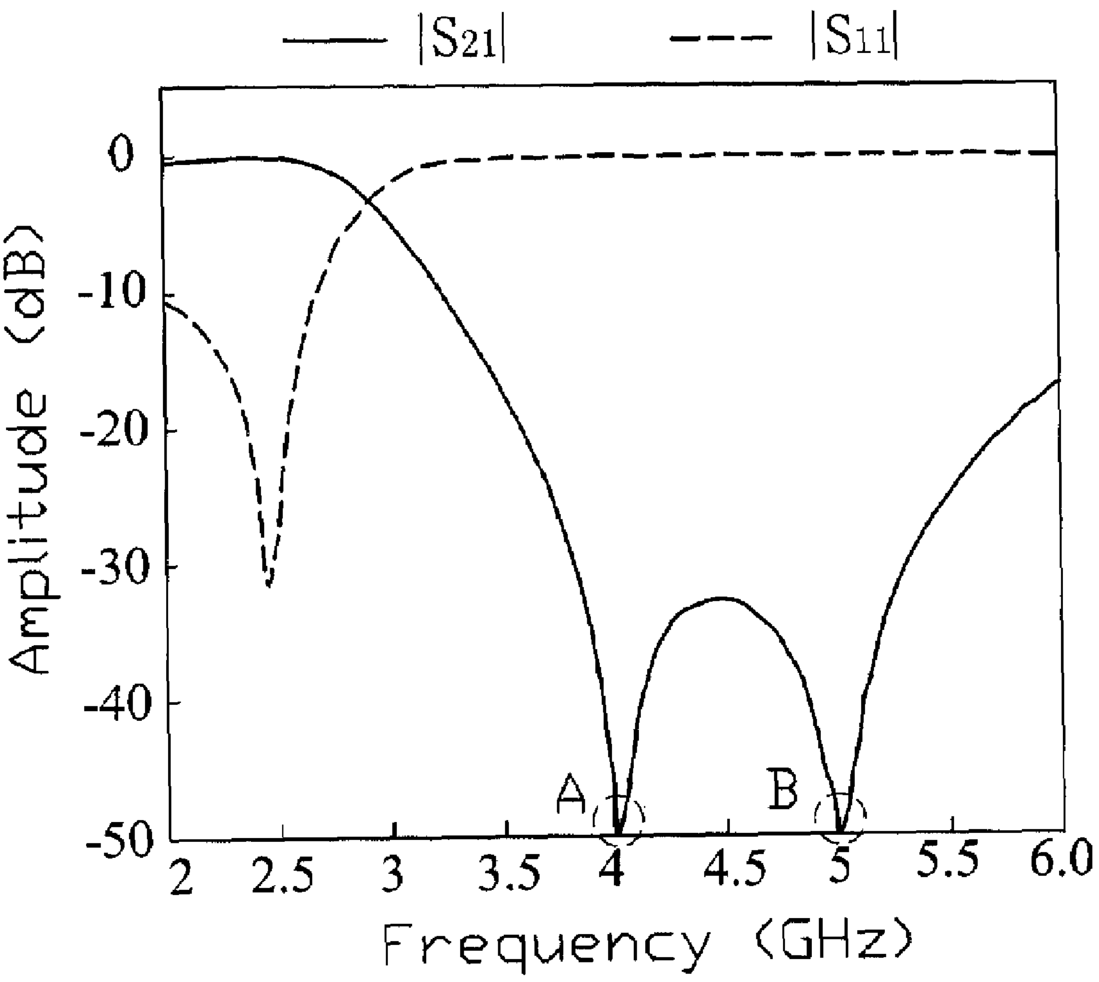
FIG. 2 is a diagram showing a relationship between insertion or return loss and frequency of electromagnetic signals through the low-pass filter.

FIG. 2 is a diagram showing a relationship between an insertion or return loss and frequency of an electromagnetic signal traveling through the low-pass filter 100. The horizontal axis represents the frequency in gigahertz (GHz) of the electromagnetic signal traveling through the low-pass filter 100, and the vertical axis represents the insertion or return loss in decibels (dB) of the low-pass filter 100. The insertion loss indicates a relationship between input power and output power of the electromagnetic signals traveling through the low-pass filter 100, and is represented by the following equation:

Insertion Loss=−10*Log [(Input Power)/(Output Power)].

When the electromagnetic signals travel through the low-pass filter 100, a part of the input power is returned to a source of the electromagnetic signal. The part of the input power returned to the source of the electromagnetic signal is called return power. The return loss indicates a relationship between the input power and the return power of the electromagnetic signal traveling through the low-pass filter 100, and is represented by the following equation:

Return Loss=−10*Log [(Input Power)/(Return Power)].

For a filter, when the output power of the electromagnetic signal in a band-pass frequency range is close to the input power of the electromagnetic signal, and the return power of the electromagnetic signal is small, it means that a distortion of the electromagnetic signal is small and the performance of the band-pass filter is good. That is, the smaller the absolute value of the insertion loss of the electromagnetic signal, the bigger the absolute value of the return loss of the electromagnetic signal, and the better the performance of the filter. As shown in FIG. 2, the low-pass filter 100 has good performance. The absolute value of the insertion loss of the electromagnetic signal in the band-pass frequency range is close to 0, and the absolute value of the return loss of the electromagnetic signal is greater than 10. A transmission zero point A is close to a pass band of the low pass filter 100. And a transmission zero point B is close to the harmonic of the desired signal to suppress to EMI effect.

In this embodiment, the electromagnetic signals are fed into the first coupling line 180 and the second coupling line 190, and a coupling capacitor is formed, which combines the transmission line 160 to generate two transmission zeros for the increase of roll-off of the attenuation band and effective suppression of harmonic response.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical applications, and to enable others of ordinary skill in the art to understand the invention for various embodiments with various modifications as are suited to the particular use contemplated.

The invention claimed is:

1. A low-pass filter comprising:

an input line for input of an electromagnetic signal;

an output line for output of the electromagnetic signal;

a transmission line electrically connected to the input line and the output line, for capturing and transmitting the electromagnetic signal;

a first coupling line comprising a first open end, and a first feed-in end electrically connected to the transmission line; and a second coupling line comprising a second open end, and a second feed-in end electrically connected to the transmission line;

wherein the first feed-in end is located opposite to the second feed-in end, and the transmission line, the first coupling line, and the second coupling line collectively form a substantially G shape.

2. The low-pass filter as recited in claim 1, wherein the transmission line comprises a first transmission part electronically connected to the first feed-in end.

3. The low-pass filter as recited in claim 2, wherein the transmission line further comprises a second transmission part electronically connected to the first transmission part and the input line.

4. The low-pass filter as recited in claim 3, wherein the transmission line further comprises a third transmission part electronically connected to the second transmission part and the output line.

5. The low-pass filter as recited in claim 4, wherein the transmission line further comprises a fourth transmission pan electronically connected to the third transmission part and the second feed-in end.

6. The low-pass filter as recited in claim 3, wherein the first coupling line is parallel to the second coupling line and the second transmission part.

7. The low-pass filter as recited in claim 6, wherein the first coupling line is arranged between the second coupling line and the second transmission part.

8. The low-pass filter as recited in claim 7, wherein the transmission line is arranged around the first coupling line and the second coupling line.

9. A filter comprising:

an input line of said filter to input an electromagnetic signal into said filter;

an output line of said filter to output said electromagnetic signal out of said filter;

at least two coupling lines extending parallel to each other along a preset direction and spaced from each other so as to establish capacitive ability thereof for said filter; and a transmission line electrically connecting said input line and said output line with said at least two coupling lines, at least one transmission part of said transmission line extending along said preset direction parallel to said at least two coupling lines and spaced from one of said at least two coupling lines so as to enhance said capacitive ability of said at least two coupling lines for said filter, said at least one transmission part directly neighboring a first side of said one of said at least two coupling lines, another of said at least two coupling lines directly neighboring a second side of said one of said at least two coupling lines, and said first side opposite to said second side.

10. The filter as recited in claim 9, wherein each of said at least two coupling lines defines a first end and a second end, said second end is opposite to said first end relative to said preset direction, said transmission line electrically connects with said one of said at least two coupling lines at said first end thereof, and said transmission line electrically connects with said another of said at least two coupling lines at said second end thereof.

11. A filter comprising:

an input line of said filter to input an electromagnetic signal into said filter;

an output line of said filter to output said electromagnetic signal out of said filter;

at least two coupling lines extending parallel to each other and spaced from each other so as to filter said input electromagnetic signal for said filter; and a transmission line electrically connecting said input line and said output line with said at least two coupling lines, said transmission line extending substantially around said at least two coupling lines so as to cooperatively define a space with one of said at least two coupling lines for another of said at least two coupling lines to be substantially completely located between said transmission line and said one of said at least two coupling lines.

12. The filter as recited in claim 11, wherein each of said at least two coupling lines defines a first end and a second end, said second end is opposite to said first end relative to a preset direction, said transmission line electrically connects with said one of said at least two coupling lines at said first end thereof, and said transmission line electrically connects with said another of said at least two coupling lines at said second end thereof.

13. The filter as recited in claim 11, wherein said transmission line, said one of said at least two coupling lines, and said another of said at least two coupling lines cooperatively form a substantially G shape.

14. The filter as recited in claim 9, wherein said transmission line, said one of said at least two coupling lines, and said another of said at least two coupling lines cooperatively form a substantially G shape.

* * * * *